United States Patent [19]

Sparks

[11] Patent Number: 4,475,142
[45] Date of Patent: Oct. 2, 1984

[54] LOW PROFILE KEYBOARD SWITCH

[75] Inventor: Daniel R. Sparks, Temple City, Calif.

[73] Assignee: Becton Dickinson and Company, Paramus, N.J.

[21] Appl. No.: 529,915

[22] Filed: Sep. 7, 1983

Related U.S. Application Data

[63] Continuation-in-part of Ser. No. 349,349, Feb. 16, 1982, Pat. No. 4,408,252.

[51] Int. Cl.³ .......................... H01G 5/16; H01H 3/12
[52] U.S. Cl. .................................. 361/288; 400/479.1
[58] Field of Search ................... 361/288; 200/159 B; 400/479.1; 340/815.13

[56] References Cited

U.S. PATENT DOCUMENTS

| | | | |
|---|---|---|---|
| 3,750,113 | 7/1973 | Cencel | 340/815.13 |
| 4,090,229 | 5/1978 | Cencel et al. | 361/288 |
| 4,300,029 | 11/1981 | Maser | 200/159 B |
| 4,307,268 | 12/1981 | Harper | 200/159 B X |
| 4,363,942 | 12/1982 | Deeg et al. | 200/159 R X |
| 4,408,252 | 10/1983 | Voge et al. | 361/288 |
| 4,412,754 | 11/1983 | Sparks | 400/496 |

Primary Examiner—Donald A. Griffin
Attorney, Agent, or Firm—Robert P. Grindle

[57] ABSTRACT

A capacitance keyboard switch is provided which reduces in a keyboard the overall space requirements therefore while providing at the same time the property of increasing the switch module force curve in the activating movement thereof. The tactile feel construction includes a reduced number of integrally molded inexpensive parts.

6 Claims, 5 Drawing Figures

LOW PROFILE KEYBOARD SWITCH

This application is a continuation-in-part of prior co-pending application Ser. No. 349,349 filed Feb. 16, 1982 now U.S. Pat. No. 4,408,252 issued Oct. 4, 1983, which is incorporated herein by reference in its entirety.

BACKGROUND AND STATEMENT OF THE INVENTION

The present invention relates generally to keyboards and capacitive keys for use in such keyboards, and particularly relates to an improved mechanical design for a capacitive key which incorporates deliberate tactile feel for the operator, and in which a much less complicated assembly is utilized eliminating the need for a housing or frame for the assembly.

Keyboards such as that to which the present invention relates are widely used in information processing input terminals, for example. U.S. Pat. No. 3,750,113 to Cencel, assigned to the assignee of the present invention, discloses circuit techniques for utilizing capacitive keys of the type described in the present invention. Prior co-pending application Ser. No. 349,349 is directed mainly to the specific assembly of each of such keys. Each key corresponds to a particular piece of data or operation which the operator selects by depressing the key. Typically, a modest pre-load is applied to the key to maintain it in its normal position, thereby reducing the likelihood of accidental actuation and requiring a positive, conscious effort by the operator to depress the key. The key surface touched by the operator is connected to a plunger which extends into the data processing machine for actuating the mechanism of the key therein. A simple camming arrangement, as disclosed herein, built into the plunger of each key enables the operator to "sense" a response to the tactile force applied to the key in order for the operator to have a positive feeling in the activation of the key.

One representative prior art capacitive key arrangement is that described and claimed in U.S. Pat. No. 4,090,229 to Cencel et al. That patent teaches a movable capacitor plate in the form of a single sheet with the plate formed into a spring which is elastically deformed by alteration of the sheet into its deformed condition, with that deformed condition being the "off" position of the key. That particular form of capacitive key requires a housing for supporting the assembly.

With the invention of the said co-pending prior application an improved low profile capacitive key is provided as a keyboard switch with a substantially reduced overall height which may be, for example, 0.750 inches (19.05 mm.) for the entire assembly and a length of travel of 0.15 inches (3.81 mm). Because of this, the keyboard switch is particularly useful for low profile keyboards, as will be appreciated by practitioners-in-the-art. This is achieved, as discussed above, by eliminating the need for any housing for the switch assembly at all and by providing a combination assembly supported directly on the printed circuit board, and wherein the parts are snap-fitted together, eliminating the need for hardware such as screws or nuts for connecting the parts. As will be appreciated, this elimination of a housing and hardware reduces substantially the cost of such an assembly and makes it particularly useful for mass production techniques.

A further feature is that one plate forming one side of the capacitive key is developed from the metal laminate formed on the printed circuit board for providing the printed circuit of the keyboard. It will be appreciated, that by forming the printed circuit and the one plate of the capacitive key simultaneously, a substantial reduction in cost of the assembly is further achieved.

Furthermore, because of the simplified assembly, a plunger part is utilized, connected to the key top, which has a depending plunger switch activation stem of a specific length. Because of the simplified construction of this part, which may be comprised of a molded plastic material, the length of the switch activation stem may be modified in order to modify in a very simple fashion the point of actuation of the switch for the signal change thereof. Thus, by interchanging this one snap-in part a simple signal change point is achieved. Moreover, because the guide stem for the plunger and the switch activation stem thereof have substantial span therebetween, there is good control of the plunger and plunger guide index in the keyboard.

As an improvement in the invention claimed in the said co-pending application, a simplified arrangement is provided herein for imparting to each key a positive tactile feel by a cam integral with the key plunger activation stem cooperating with an abutment mounted on the end of a spring which is in turn, integral with the guide body of the key plunger.

The tactile feel accomplished, in accordance herewith, therefore, is achieved only with minor modifications of two molded parts. The result is a momentary increase in the switch module force curve.

Because of the simple construction of the parts making up the assembly of the switch, the only custom part in a keyboard comprised of keys is the printed circuit board, and the electronics or printed circuits established on that board. Because the electronic components or printed circuits of the switch including both the movable and the fixed plates thereof are under the printed circuit board, the switching area and the electronic components are protected from liquid spills and plunger dusting.

With the forgoing and additional objects in view, this invention will now be described in more detail, and other objects and advantages thereof will be apparent from the following description, the accompanying drawings and the appended claims.

DETAILED DESCRIPTION OF THE INVENTION

Figure 1:
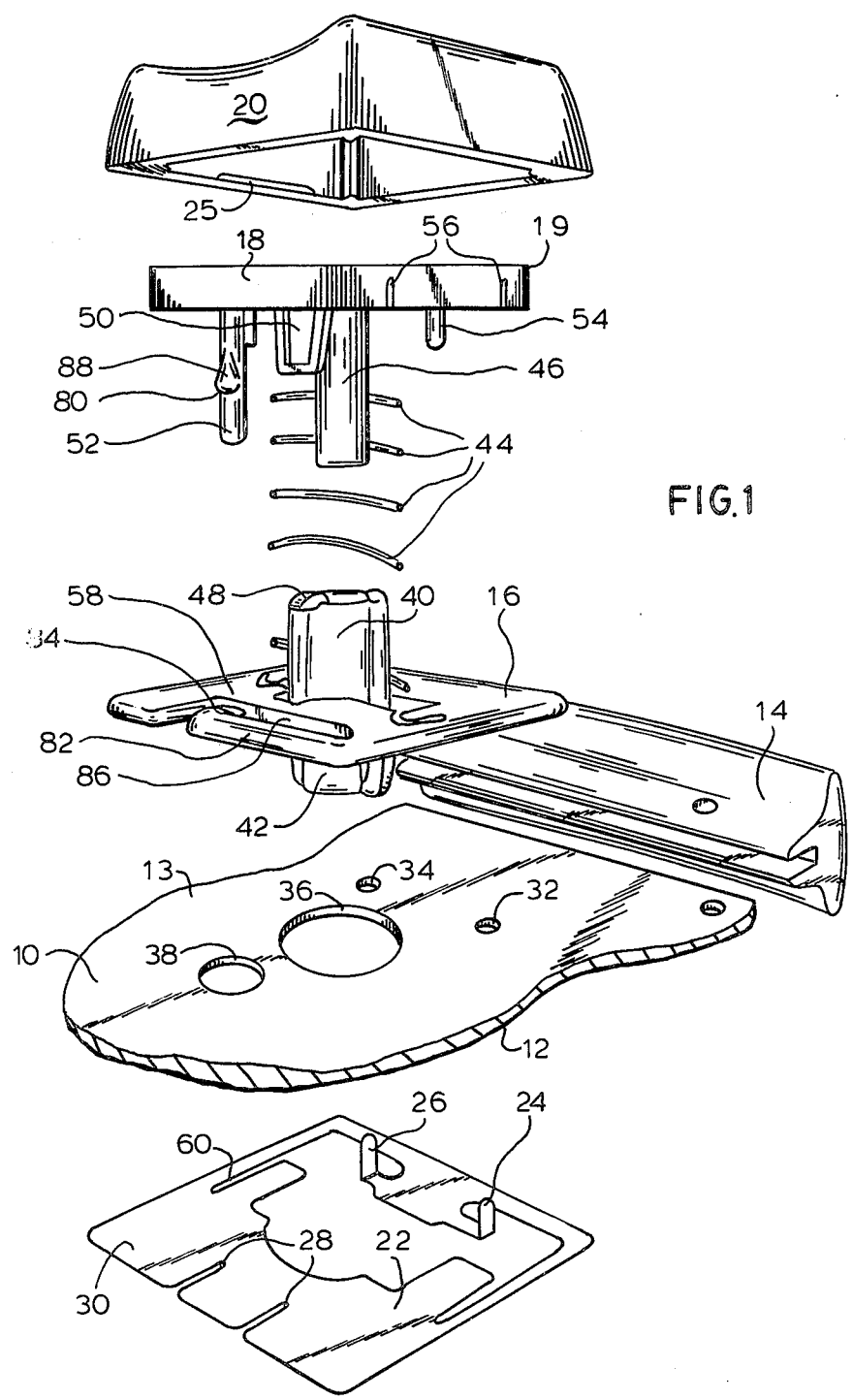
FIG. 1 is an exploded perspective view of a low profile capacitive switch assembly illustrating the invention.

Referring to the drawings in which like reference numbers refer to like parts throughout the several views thereof, FIG. 1 shows an exploded view of the arrangement of parts in the low profile capacitive switch assembly of the invention. 10 designates a portion of the printed circuit board of a low profile keyboard which printed circuit board may be supported at its marginal edges by a stiffener 14, as well known in the art. As well known in the art, further, the printed circuit board may be comprised of, for example, fiberglass or other electrically non-conducting material.

Laminated to the bottom surface 12 of printed circuit board 10 is a copper layer which is, as will be appreciated by practitioners-in-the-art, etched away to form a printed circuit and a fixed capacitor plate. The fixed plate is segregated from the rest of the printed circuit by a solder mask which is applied over the etched copper.

Positioned below the printed circuit board 10 is a movable capacitor plate 22 in the form of a single sheet of, for example, CA725 Copper Alloy in and cut out in the manner shown in FIG. 1 to provide the desired flexibility for the single sheet in its flexing movement in actuating the switch of the invention. Plate 22 has two integral tabs 24, 26 which extend up through holes 32, 34, respectively, in printed circuit board 10. These tabs are bent over the top surface 13 of printed circuit board 10 and soldered into place so as to maintain plate 22 flat adjacent the bottom surface 12 of the printed circuit board 10.

The relatively large portion 30 of plate 22 has opposed to it once the plate 22 is positioned against the surface 12 the fixed capacitor plate on the bottom surface 12 of printed circuit board 10. The fixed plate is not shown for clarity since it is a well known structure in the art.

Thus, the movable plate 22 cooperates with the fixed plate formed on the bottom surface in the copper alloy laminate to actuate the capacitance switch. Formed in one edge surface of the portion 30 of plate 22 are cut out portions 28 which serve as stress relievers in plate 22 during the flexing thereof in the actuation of the switch. The cut out portions 60, in turn, serve to define the flex point of plate 22, and to provide an additional point of stress relief during flexing.

Positioned immediately above the upper surface 13 of circuit board 10 is a snap-in guide body 16 which has a depending portion 42 which, upon assembly, extends through opening 36 in printed circuit board 10 and snaps into place holding guide body 16 firmly adjacent the upper surface 13 of printed circuit board 10. Snap-in guide body 16 includes an integral annular central guide 40 extending upwardly therefrom which guide 40 includes an integral hook 48 for reciprocable locking engagement with depending U-shaped portion 50 of plunger body 18 of the assembly, to be described below. Thus, U-shaped part 50 defines the degree of reciprocation between guide body 16 and plunger body 18, and serves as a stop for plunger body 18 in its return movement.

Plunger body 18 includes an integral annular guide stem 46 which reciprocates in annular guide 40. Cooperating parts 40, 46 serve to guide the vertical movement of the plunger body 18 when the key switch is activated. Positioned between parts 16 and 18 is a helical spring 44 which is mounted to urge plunger body 18 upwardly away from the guide body 16. Also integral with the plunger body 18 is the switch activation stem 52. Stem 52 extends through opening 58 in guide body 16 and opening 38 in printed circuit board 10 to move against the portion 30 of plate 22, upon an operator pressing the switch key of the invention. Thus, stem 52 moves downwardly until it engages plate 22, and thereafter moves movable capacitor plate 22 away from the fixed plate on the bottom surface 12 of printed circuit board 10. This movement serves to actuate the switch. The individual openings 56 placed in spaced apart fashion along the depending side wall 19 of plunger body 18 serve to define a flexible portion for receiving in snap-fit engagement the adjacent integral bracket 25 of key cap 20, when key cap 20 is press fit onto the plunger body 18. Brackets 25 snap into place under the edge of the side walls 19 of plunger body 18.

In accordance with the invention herein, stem 52 includes along one area thereof a cam 80 integral therewith. Cam 80 cooperates with an abutment 84 mounted on guide body 16 adjacent opening 58. That is, formed integrally with guide body 16 is a cantilevered spring 82 defined by elongated opening 86. Opening 86, in turn, extends from opening 58 along the cantilevered spring 82. At the opposite end of spring 82 is abutment 84, again formed as an integral part of guide body 16. Because of the flexible nature of the material of guide body 16, and the cantilevered nature of spring 82, there is a spring action between the engaging surfaces of abutment 84 on spring 82 and cam 82 on switch activation stem 52. Thus, when cam 80 passes abutment 82, there is a momentary increase in the switch module force curve, giving the operator the "feel" of activation of the key and associated switch. On return, the sloped surface 88 of cam 80 allows abutment 84 to "ride" over cam 80 with reduced movement.

Figure 2:
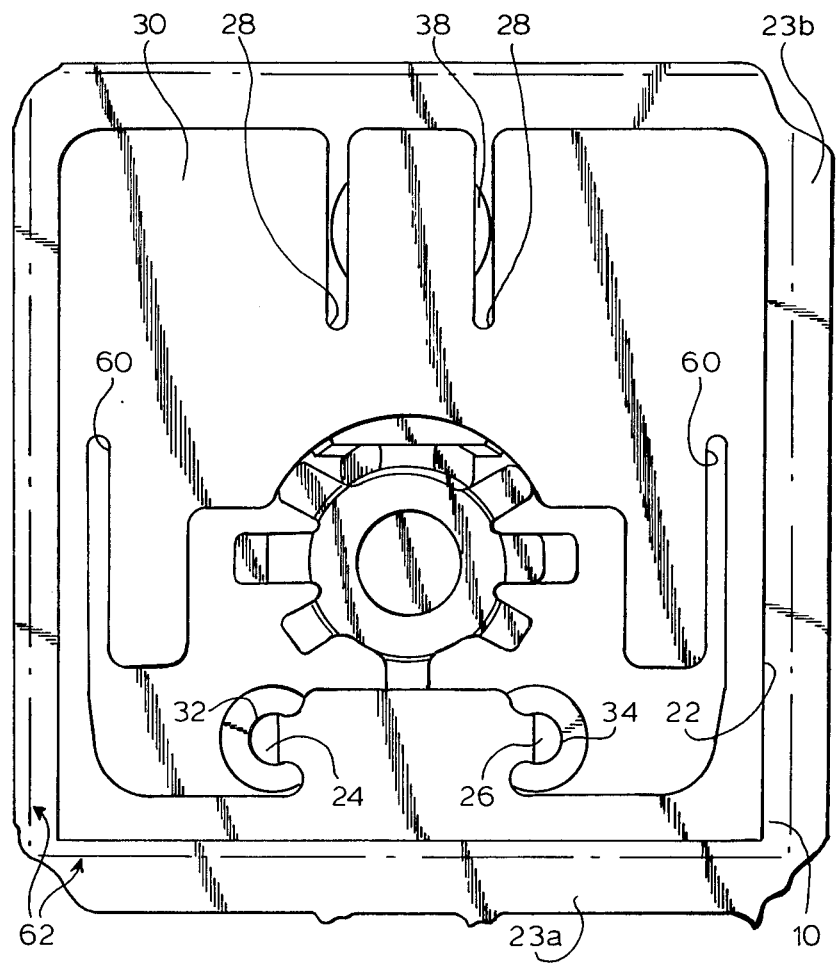
FIG. 2 is a view of the low profile switch of the invention as viewed from the bottom surface of the printed circuit board on which it is supported.

Referring now to FIG. 2, an individual movable plate 22 is shown fixed to one portion of the bottom surface 12 of printed circuit board 10. The area defined by the margin lines 62 shown in FIG. 2 may be, for example, 0.750 square inches (4.838 square centimeters). As can be seen in FIG. 2, tabs 24, 26 extend through openings 32, 34 respectively in printed circuit board 10. Tabs 24, 26 are bent over surface 13 and soldered to maintain plate 22 fixed in its position on the bottom surface of the printed board 10. As can be seen, further, in FIG. 2, other switch assemblies may be mounted adjacent to the one shown in FIG. 2 such as 23a and 23b.

Figure 3:
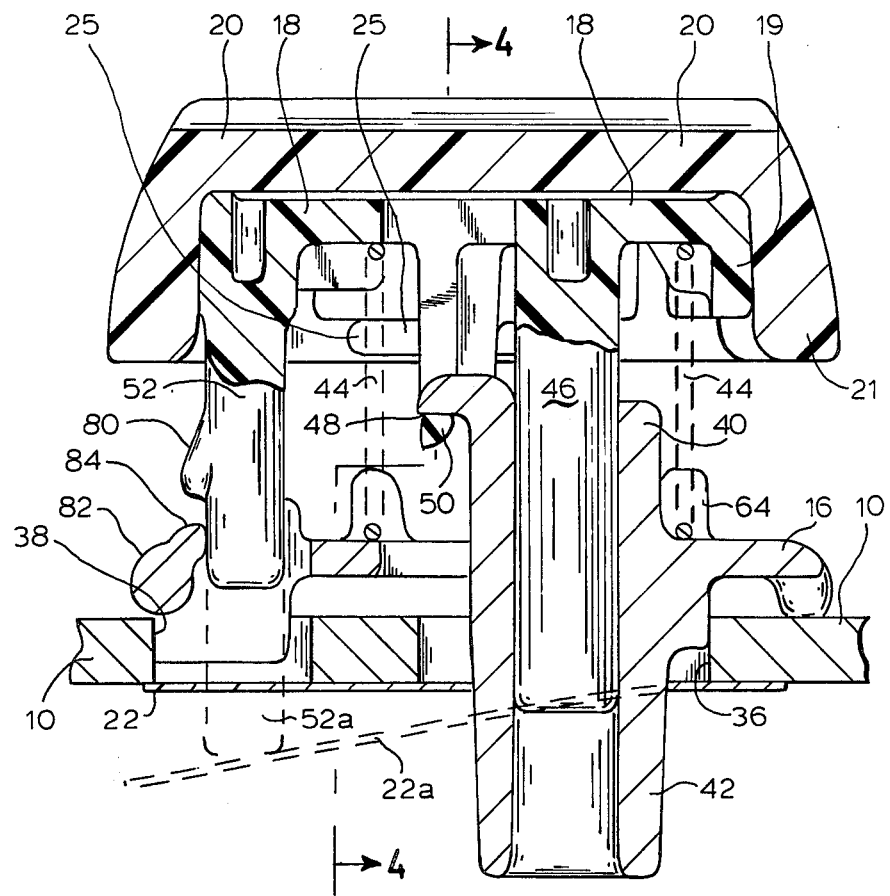
FIG. 3 is a vertical sectional view of the low profile capacitive switch assembly of FIG. 1 showing the parts assembled and supported on the printed circuit board.

Referring now to FIG. 3, the assembly is shown in section with the cooperating arrangement of the guide stem 46 with the guide 40 and the cooperating locking engagement of the parts 48, 50. The plunger 52 and movable plate 22 are shown in their upper non-activated positions and also shown in dotted line positions 52a and 22a in the switch activated position of the assembly. As can be seen further in FIG. 3, stem 52 has extending integrally therefrom a cam 80 for cooperating with abutment 84 on spring 82. Guide body 16 includes four spaced apart upwardly extending integral posts 64. These serve to locate the lower end of spring 44 in place. Plunger body 18, in turn, includes cooperating integral downwardly extending posts 54 for maintaining the upper edge of spring 44 in proper position, as can be seen in FIG. 4.

Figure 4:
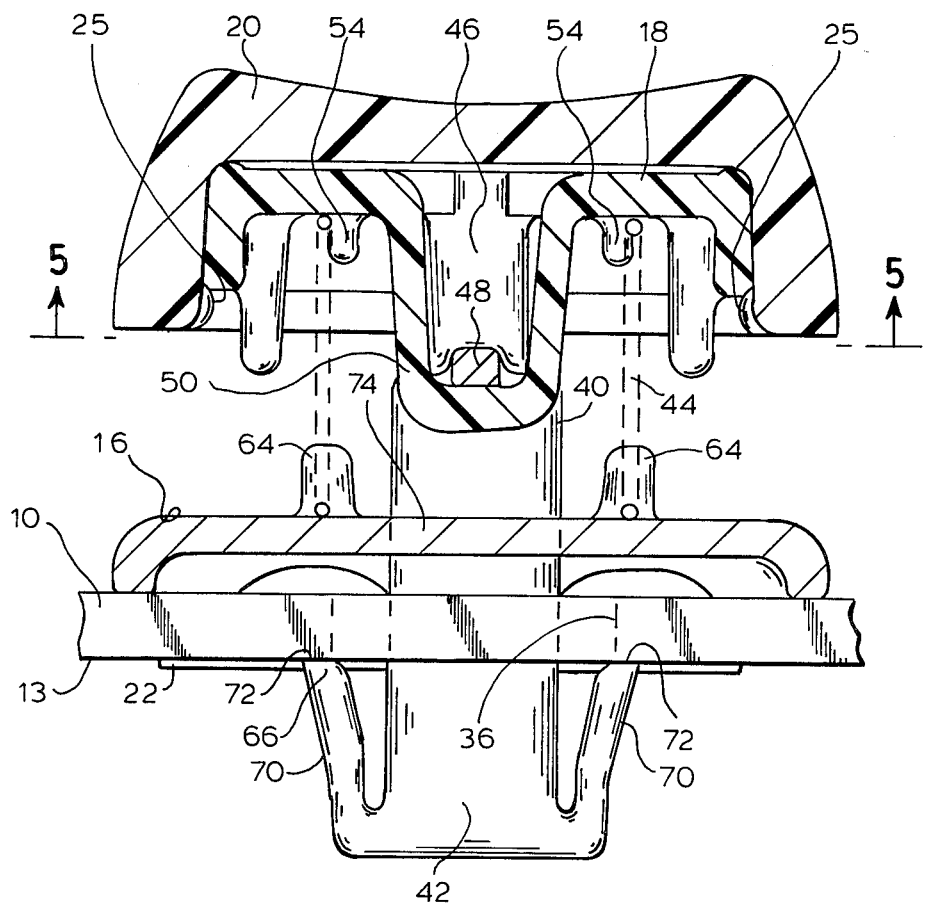
FIG. 4 is a sectional view taken along lines 4—4 of FIG. 3.

Referring now to FIG. 4, it can be seen that the lower depending portion 42 of guide 40 includes laterally extending locking arms 66, 68 with outer angled surfaces 70 which cooperate with the walls of opening 36 in printed circuit board 10 for engaging and receiving depending portion 42 therethrough. Because of the inherent spring properties of the flexible plastic material of which guide body 16 is comprised, arms 66, 68 spring outwardly once they have passed through opening 36 and extend beyond opening 36 to engage the bottom surface 13 of printed circuit board 10. During this mounting procedure, again because of inherent flexible nature of the material comprising guide body 16, the central portion 74 thereof has a tendency, during the insertion of portion 42 through opening 36 to have a snap action property with the central portion 74 moving downwardly during the insertion procedure. Thus, once arms 66, 68 clear the opening 36, and the central portion 74 of guide body 16 is released, there is a spring action moving the top surface or arms 66, 68 against surface 12 which creates a rigid fixed position of guide body 16 on printed circuit board 10. Because of this, each individual switch assembly is maintained in a rigid fixed position in its desired place upon printed circuit board 10.

Figure 5:
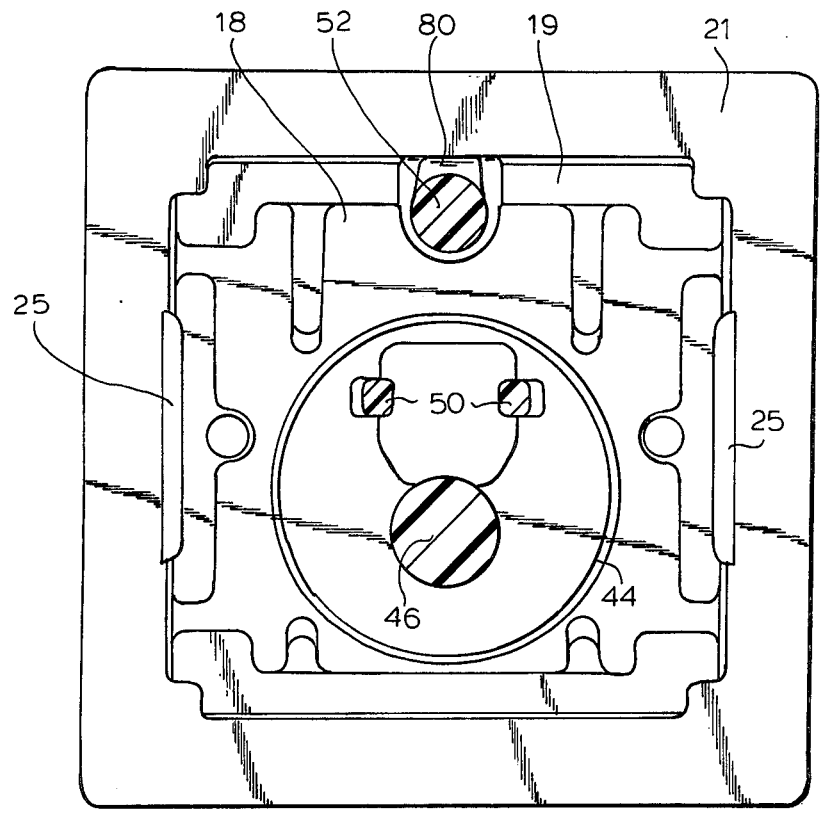
FIG. 5 is a sectional view taken along lines 5—5 of FIG. 4.

FIG. 5 shows the assembly of key cap 20 on plunger body 18 with the brackets 25 integral with the depending walls 21 of key cap 20 engaging the lower surface of the walls of the plunger body 18. Further, FIG. 5 shows the span between the plunger guide stem 46 and the plunger switch activation stem 52.

As discussed above, the various parts may be comprised of resin material such as thermoplastic which may be readily formed in molds by conventional mass production techniques. The resin materials are selected so as to provide a built-in flexible property to the various parts so they may be readily snapped together as described above. One representative material is Delrin, a product of E. I. DuPont Corporation, which is an acetal resin, a polyformaldehyde homopolymer. Other representative materials may be, for example, polyesters, as will be appreciated by practitioners-in-the-art of molding parts similar to those described and claimed herein. With respect to the material of the movable sheet capacitor plate of the invention, while CA725 copper alloy is preferred, other materials may be used such as berellium-copper alloy, for example. Other alloys may also be used, as long as the property thereof is such that they will give the proper degree of flexibility and electrical capacitance and maintain those properties over a long period of use.

Accordingly, as will be apparent from the foregoing, there is provided, in accordance herewith, a simplified low profile keyboard switch assembly incorporating an improved precise tactile feel for each switch, and which may be constructed of simplified parts, which parts, in turn, may be snapped together readily and simply without the use of separate hardware such as screws and nuts. Moreover, as discussed in the above-noted copending application, the arrangement is such that a much reduced overall height switch assembly is provided which may be, for example, 0.750 inches in overall height. Although the assembly height has been reduced, the length of travel can be as much as 0.15 inches.

The simplified assembly of the invention eliminates the need for specially devised springs or separate parts to impart the desired tactile property, and the assembly is extremely inexpensive to produce as compared to prior art arrangements.

Obviously, all of the above serves to make the apparatus, in accordance herewith, highly advantageous commercially because of the simplicity of the assembly of parts and of the reduced cost of formulating the parts, and because of the reduced amount of parts necessary to provide the assembly.

While the apparatus herein disclosed forms the preferred embodiments of this invention, this invention is not limited to that specific apparatus, and changes can be made therein without departing from the scope of this invention which is defined in the appended claims.

What is claimed is:

1. Apparatus for a capacitive switch for a low profile keyboard comprising
   (a) a printed circuit board;
   (b) a fixed capacitor plate;
   (c) a movable capacitor plate;
   (d) a movable plunger key body for moving said movable capacitor plate from a first position adjacent said fixed capacitor plate to a second position away from said fixed capacitor plate;
   (e) resilient means positioned between said plunger key body and said printed circuit board for urging said plunger key body from said second position to said first position;
   (f) an etched metallic laminate on the bottom surface of said printed circuit board with a portion thereof forming said printed circuit and said fixed capacitor plate;
   (g) a guide opening in said printed circuit board;
   (h) a guide body with a portion thereof extending through and in snap-fit engagement with said guide opening;
   (i) a guide stem integral with said plunger body for reciprocable cooperating guiding engagement with said guide body;
   (j) cooperating integral locking means on said guide body and said plunger body for maintaining said guide body and said plunger in a fixed reciprocable relationship with each other;
   (k) an integral switch activation stem of said plunger body reciprocable with said plunger body through cooperating openings in said guide body and said printed board;
   (l) said switch activation stem for moving said movable capacitor plate from said first position to said second position.
   the improvement characterized by
   (m) a cam integrally formed on said switch activation stem;
   (n) a spring body integral with and cantilevered on said guide body; and
   (o) an abutment integrally formed on said spring body opposite the end connected to said guide body;
   (p) whereby movement of said switch activation stem causes cooperating engagement between said cam and said abutment to increase momentarily the force curve required to move said movable capacitor plate from said first portion to said second position.

2. The apparatus of claim 1, further characterized by
   (a) an elongated sloping upper surface on said cam allowing smooth passage of said cam and said spring body abutment in the return movement of said switch activation stem.

3. Capacitive key apparatus for a low profile keyboard, comprising
   (a) a fixed capacitor plate for mounting on the bottom surface of a keyboard;
   (b) a movable capacitor plate;
   (c) a movable plunger key body for moving said movable capacitor plate from a first position adjacent said fixed capacitor plate to a second position away from said fixed capacitor plate;
   (d) a guide body with an integral lower extending portion thereof for snap fit engagement with a keyboard;

(e) resilient means positioned between said guide body and said movable plunger key body for urging said plunger key body from said second position to said first position;
(f) a guide stem integral with said plunger body for reciprocable cooperating guiding engagement with said guide body;
(g) cooperating integral locking means on said guide body and said plunger body for maintaining said guide body and said plunger in a fixed reciprocable relationship with each other;
(h) an integral switch activation stem on said plunger body reciprocable with said plunger body through cooperating openings in said guide body and a keyboard on which it is mounted;
(i) said switch activation stem for moving said movable capacitor plate from said first position to said second position.

the improvement characterized by (j) a cam integrally formed on said switch activation stem;

(k) a spring body integral with and cantilevered on said guide body; and
(l) an abutment integrally formed on said spring body opposite the end connected to said guide body;
(m) whereby movement of said switch activation stem causes cooperating engagement between said cam and said abutment to increase momentarily the force curve required to move said movable capacitor plate from said first position to said second position.

4. The apparatus of claim 3, further characterized by
(a) an elongated sloping upper surface on said cam allowing smooth passage of said cam and said spring body abutment in the return movement of said switch activation stem.

5. The apparatus of claim 3, further characterized by
(a) the vertical extent of said apparatus is 19.05 millimeters.

6. The apparatus of claim 3, further characterized by
(a) the extent of reciprocation of said switch activation stem is 3.81 millimeters.

* * * * *